(12) United States Patent
Rachmady et al.

(10) Patent No.: US 10,008,565 B2
(45) Date of Patent: Jun. 26, 2018

(54) SEMICONDUCTOR DEVICES WITH GERMANIUM-RICH ACTIVE LAYERS AND DOPED TRANSITION LAYERS

(71) Applicant: Intel Corporation, Santa Clara, CA (US)

(72) Inventors: Willy Rachmady, Beaverton, OR (US); Van H. Le, Portland, OR (US); Ravi Pillarisetty, Portland, OR (US); Jessica S. Kachian, Portland, OR (US); Marc C. French, Forest Grove, OR (US); Aaron A. Budrevich, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/626,018

(22) Filed: Jun. 16, 2017

(65) Prior Publication Data

US 2017/0288019 A1    Oct. 5, 2017

Related U.S. Application Data

(63) Continuation of application No. 15/334,112, filed on Oct. 25, 2016, now Pat. No. 9,691,848, which is a
(Continued)

(51) Int. Cl.
*H01L 31/0328*  (2006.01)
*H01L 31/0336*  (2006.01)
(Continued)

(52) U.S. Cl.
CPC .......... *H01L 29/0673* (2013.01); *B82Y 10/00* (2013.01); *B82Y 40/00* (2013.01);
(Continued)

(58) Field of Classification Search
CPC ............... H01L 29/0603; H01L 29/167; H01L 29/66477; H01L 29/78
(Continued)

(56) References Cited

U.S. PATENT DOCUMENTS 7,145,167 B1    12/2006 Chu
7,791,063 B2    9/2010 Hudait et al.
(Continued)

FOREIGN PATENT DOCUMENTS

CN          10790790 A    7/2010
KR    10-1998-0083547 A    12/1998
(Continued)

OTHER PUBLICATIONS

International Search Report and Written Opinion dated Sep. 24, 2013 for PCT/US2013/045979 filed Jun. 14, 2013.
(Continued)

*Primary Examiner* — David S Blum
(74) *Attorney, Agent, or Firm* — Schwabe, Williamson & Wyatt, P.C.

(57) ABSTRACT

Semiconductor device stacks and devices made there from having Ge-rich device layers. A Ge-rich device layer is disposed above a substrate, with a p-type doped Ge etch suppression layer (e.g., p-type SiGe) disposed there between to suppress etch of the Ge-rich device layer during removal of a sacrificial semiconductor layer richer in Si than the device layer. Rates of dissolution of Ge in wet etchants, such as aqueous hydroxide chemistries, may be dramatically decreased with the introduction of a buried p-type doped semiconductor layer into a semiconductor film stack, improving selectivity of etchant to the Ge-rich device layers.

10 Claims, 11 Drawing Sheets

Related U.S. Application Data continuation of application No. 14/756,789, filed on Oct. 13, 2015, now Pat. No. 9,490,329, which is a continuation of application No. 14/301,281, filed on Jun. 10, 2014, now Pat. No. 9,159,787, which is a continuation of application No. 13/717,282, filed on Dec. 17, 2012, now Pat. No. 8,748,940.

(51) Int. Cl.

| | | |
|---|---|---|
| H01L 31/072 | (2012.01) | |
| H01L 31/109 | (2006.01) | |
| H01L 29/06 | (2006.01) | |
| H01L 29/78 | (2006.01) | |
| H01L 29/66 | (2006.01) | |
| H01L 21/306 | (2006.01) | |
| H01L 29/786 | (2006.01) | |
| H01L 29/36 | (2006.01) | |
| H01L 29/775 | (2006.01) | |
| H01L 29/778 | (2006.01) | |
| H01L 29/10 | (2006.01) | |
| H01L 29/161 | (2006.01) | |
| H01L 29/165 | (2006.01) | |
| H01L 29/423 | (2006.01) | |
| H01L 21/3065 | (2006.01) | |
| B82Y 10/00 | (2011.01) | |
| B82Y 40/00 | (2011.01) | |
| H01L 29/167 | (2006.01) | |
| H01L 29/51 | (2006.01) | |
| H01L 21/02 | (2006.01) | |

(52) U.S. Cl.
CPC .... *H01L 21/3065* (2013.01); *H01L 21/30604* (2013.01); *H01L 21/30608* (2013.01); *H01L 29/1054* (2013.01); *H01L 29/161* (2013.01); *H01L 29/165* (2013.01); *H01L 29/167* (2013.01); *H01L 29/365* (2013.01); *H01L 29/42392* (2013.01); *H01L 29/511* (2013.01); *H01L 29/66439* (2013.01); *H01L 29/66477* (2013.01); *H01L 29/66628* (2013.01); *H01L 29/66742* (2013.01); *H01L 29/775* (2013.01); *H01L 29/7781* (2013.01); *H01L 29/78* (2013.01); *H01L 29/785* (2013.01); *H01L 29/786* (2013.01); *H01L 29/7848* (2013.01); *H01L 29/78696* (2013.01); *H01L 21/0245* (2013.01); *H01L 21/02381* (2013.01); *H01L 21/02532* (2013.01); *H01L 21/02584* (2013.01); *Y02E 10/50* (2013.01)

(58) Field of Classification Search
USPC ........................................................ 257/190
See application file for complete search history.

(56) References Cited

U.S. PATENT DOCUMENTS

| | | |
|---|---|---|
| 2007/0155142 A1 | 7/2007 | Jin et al. |
| 2007/0187716 A1 | 8/2007 | Chu |
| 2008/0237573 A1 | 10/2008 | Jin et al. |
| 2010/0219396 A1 | 9/2010 | Jin et al. |
| 2010/0327261 A1 | 12/2010 | Hudait et al. |
| 2011/0147711 A1 | 6/2011 | Pillarisetty et al. |
| 2011/0147713 A1 | 6/2011 | Pillarisetty et al. |
| 2012/0153387 A1 | 6/2012 | Murthy et al. |

FOREIGN PATENT DOCUMENTS

| | | |
|---|---|---|
| KR | 10-2001-0102557 A | 11/2001 |
| KR | 10-2012-0089354 A | 8/2012 |
| TW | 2012542022 A | 10/2012 |

OTHER PUBLICATIONS

Notification Concerning Transmittal of International Preliminary Report on Patentability dated Jul. 2, 2015 and International Preliminary Report on Patentability dated Jun. 23, 2015 which cites Written Opinion of the International Searching Authority dated Sep. 24, 2013 which was previously submitted in Information Disclosure Statement (IDS) dated Jun. 10, 2014 for PCT/US2013/045979.

Office Action in Primary Examination for Taiwan Patent Application 102140879 dated May 22, 2015 and Search Report and English Translation thereof.

Office Action including Search Report for Taiwan Examiner of the Intellectual Property Office (the IPO) for Taiwan Patent Application 104131636 dated May 25, 2015 and Search Report and English Translation thereof.

Notice of Preliminary Rejection (Non-Final) from the Korean Intellectual Property Office (KIPO) dated May 27, 2016 for Korean Patent Application No. 10-2015-7011150 and English Summary thereof.

Office Action from the United Kingdom Patent Office dated Aug. 24, 2016 for UK Patent Application No. GB1510002.7 (3 pages).

First Office Action from the Chinese Patent Office dated Nov. 1, 2016 for Chinese Patent Application No. 201380059464.3 (5 pages) and English Translation (4 pages) thereof.

Notice of Allowance from the Korean Intellectual Property Office dated Nov. 16, 2016 for Korean Patent Application No. 10-2015-7011150 (3 pages).

Office Action from the United Kingdom Patent Office dated Mar. 1, 2017 for UK Patent Application No. GB1618096.0, 5 pages.

Office Action from the United Kingdom Patent Office dated Mar. 1, 2017 for UK Patent Application No. GB1510002.7, 3 pages.

Office Action and Search Report from Taiwan Patent Office (IPO) for Taiwan Patent Application 105128114 dated Apr. 5, 2017 and English Translation thereof, 12 pages.

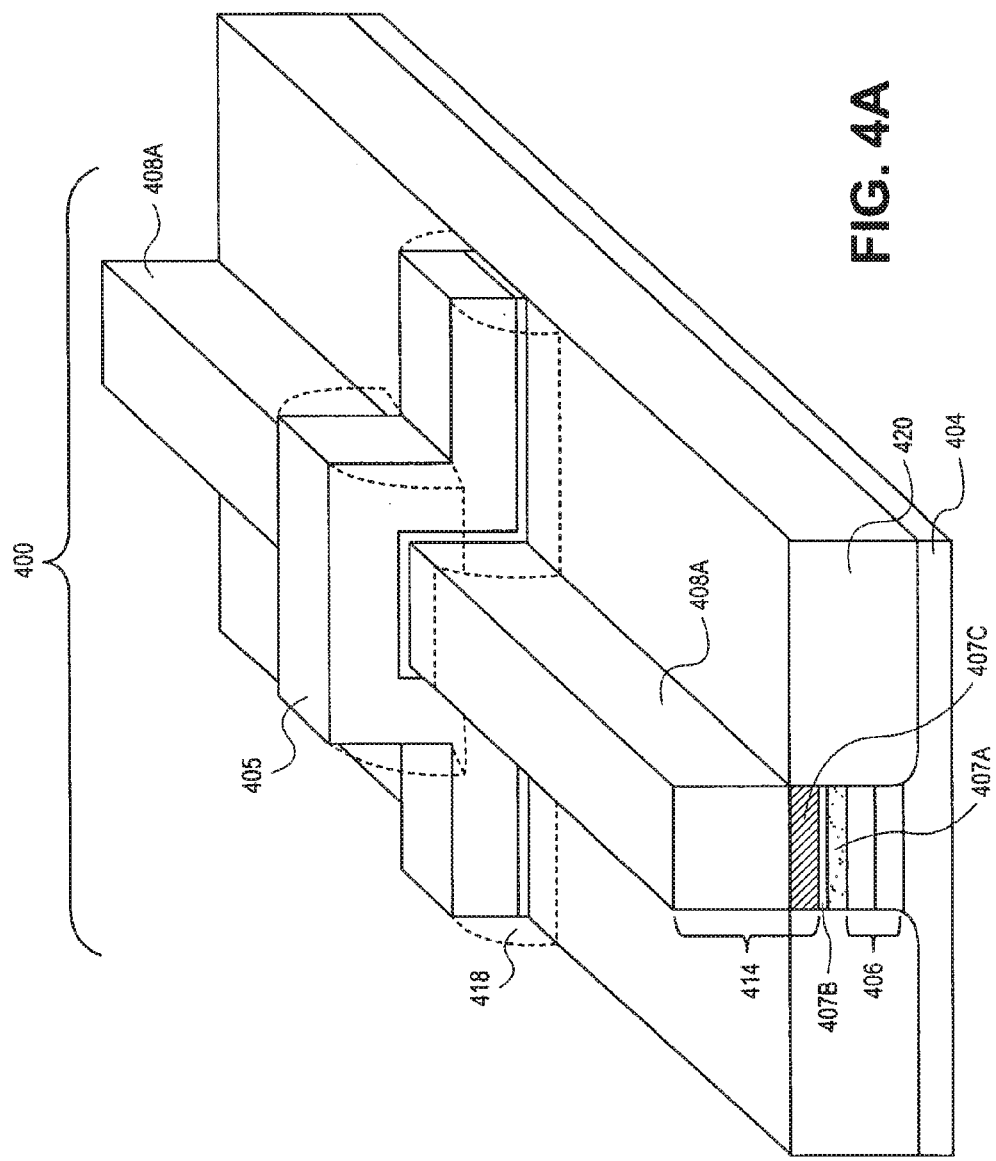

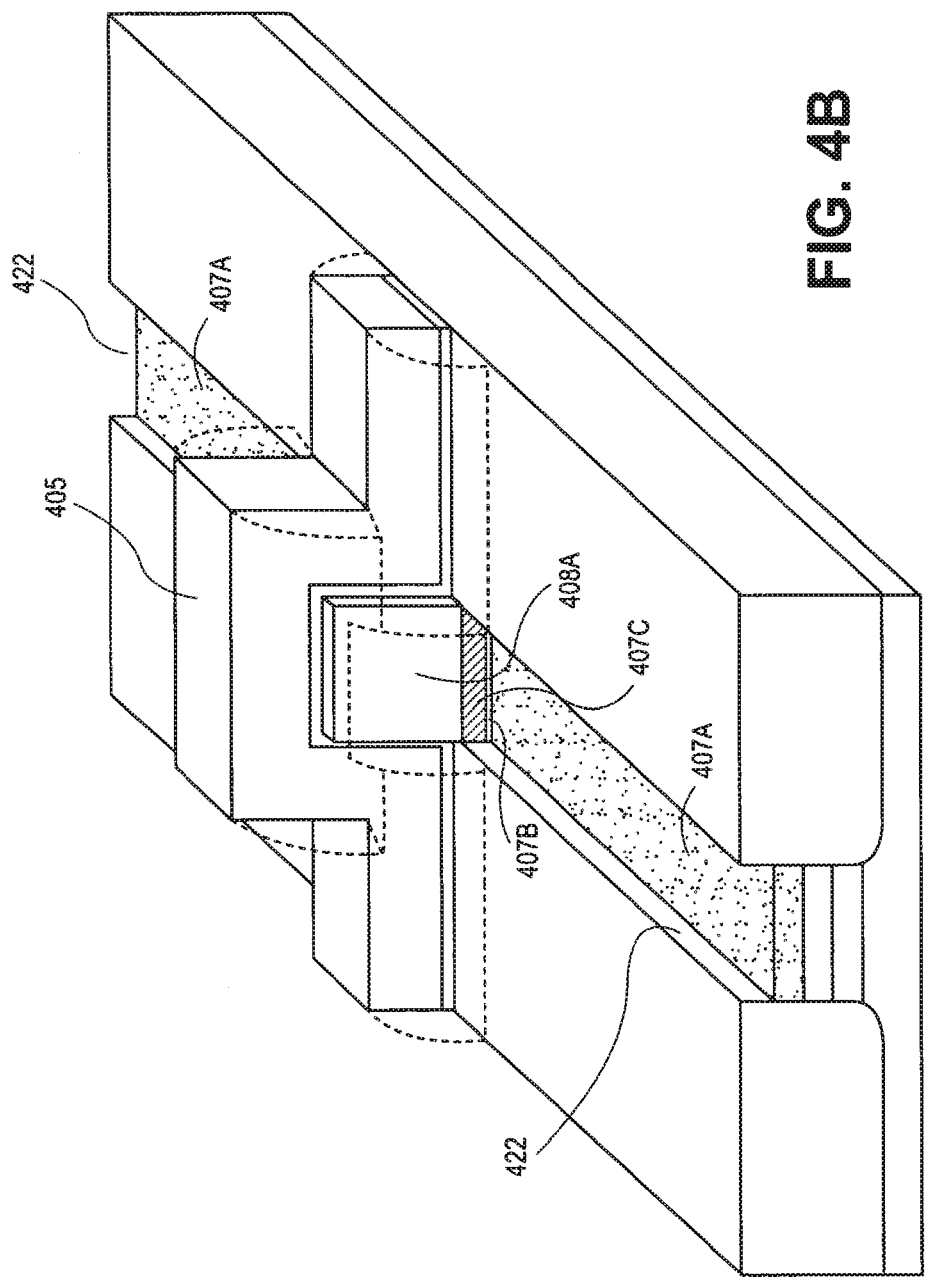

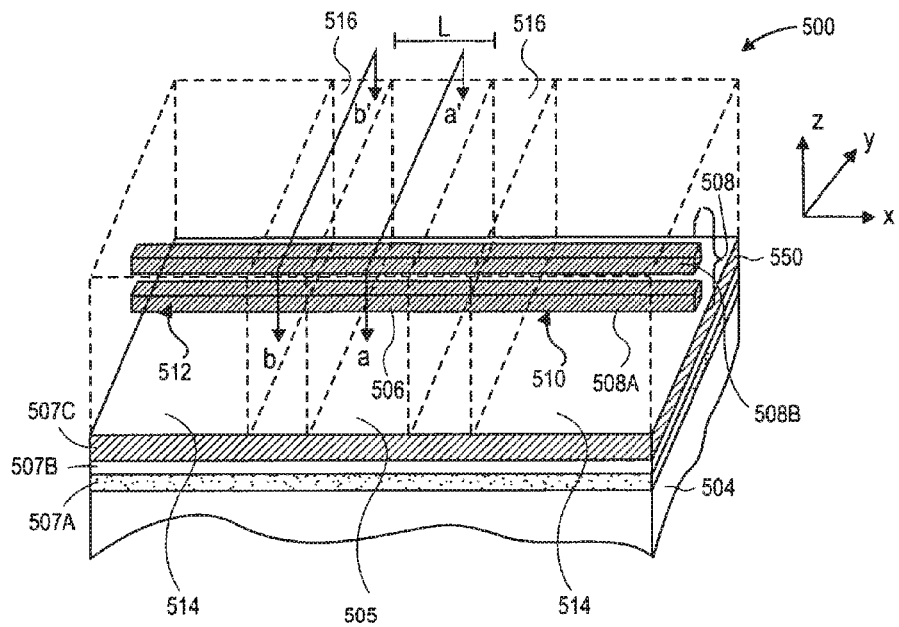
FIG. 5A
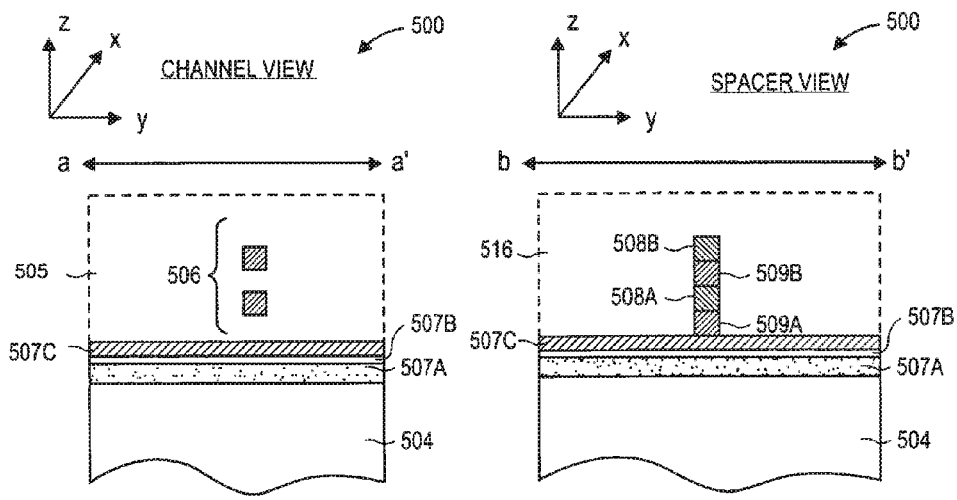
FIG. 5B
FIG. 5C

SEMICONDUCTOR DEVICES WITH GERMANIUM-RICH ACTIVE LAYERS AND DOPED TRANSITION LAYERS

This is a Continuation of Application No. 15/334,112 filed Oct. 25, 2016, now U.S. Pat. No. 9,691,848 issued Jun. 27, 2017, which is a Continuation of Application No. 14/756,789 filed Oct. 13, 2015, now U.S. Pat. No. 9,490,329 issued Nov. 8, 2016, which is a Continuation of Application No. 14/301,281 filed Jun. 10, 2014 now U.S. Pat. No. 9,159,787 issued Oct. 13, 2015, which is a Continuation of Application No. 13/717,282 filed on Dec. 17, 2012 now U.S. Pat. No. 8,748,940 issued Jun. 10, 2014 which are hereby incorporated by reference.

TECHNICAL FIELD

Embodiments of the invention are in the field of semiconductor devices and, in particular, semiconductor devices having germanium (Ge) active layers.

BACKGROUND

For the past several decades, the scaling of features in integrated circuits has enabled increased densities of functional units on a semiconductor chip. For example, shrinking transistor size allows for the incorporation of an increased number of memory devices on a chip, leading to the fabrication of products with increased capacity.

In the manufacture of field effect transistors (FETs) for integrated circuit devices, semiconducting crystalline materials other than silicon may be advantageous. An example of one such material is Ge, which offers a number of potentially advantageous features relative to silicon, such as, but not limited to, high charge carrier (hole) mobility, band gap offset, a different lattice constant, and the ability to alloy with silicon to form semiconducting binary alloys of SiGe.

One problem with the use of Ge in modern transistor designs is that the extremely fine features (e.g., 22 nm and below) that are now achieved for silicon FETs aggressively scaled over the years are now difficult to achieve in Ge, often making potential material-based performance gains a wash when implemented in less-aggressively scaled forms. The difficulty in scaling is related to the material properties of Ge, and more particularly difficulty in etching SiGe, which is often employed as an intermediate layer between a Ge active layer (e.g., transistor channel layer) and an underlying silicon substrate material, with sufficient selectively over Ge so as to remove the SiGe without eroding a finely printed Ge active layer feature.

Material stack architectures and etching techniques which enable high SiGe:Ge etch selectively are therefore advantageous.

BRIEF DESCRIPTION OF THE DRAWINGS

FIGS. 4A-4C illustrate angled views representing various operations in a method of fabricating non-planar semiconductor devices employing the semiconductor stack of FIG. 1A, in accordance with embodiments of the present invention;

FIG. 5A illustrates an isometric sectional view of a nanowire or nanoribbon semiconductor device employing the semiconductor stack of FIG. 1A, in accordance with an embodiment of the present invention;

FIG. 5B illustrates a cross-sectional channel view of the nanowire-based semiconductor structure of FIG. 5A, in accordance with an embodiment of the present invention;

FIG. 5C illustrates a cross-sectional view of the nanowire-based semiconductor structure of FIG. 5A, in accordance with an embodiment of the present invention;

DETAILED DESCRIPTION

Figure 1A:
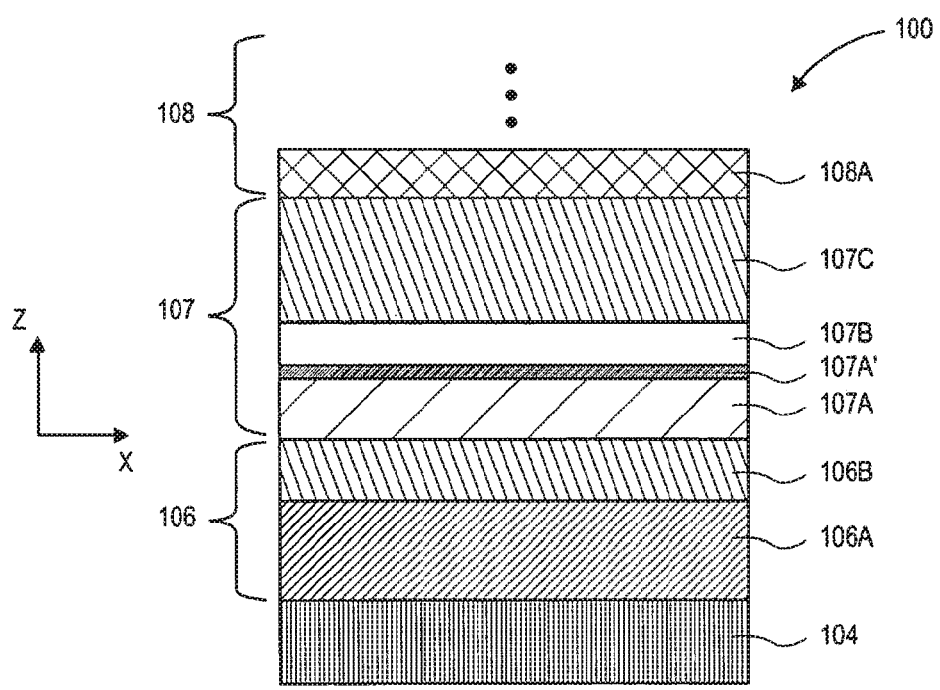
FIG. 1A illustrates a cross-sectional view of a semiconductor layer stack including a germanium device layer disposed over a delta-doped p-type transition layer, in accordance with an embodiment of the present invention.

Semiconductor devices having Ge-rich active layers disposed over a doped semiconductor transition layers are described. In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer or component with respect to other layers or components. For example, one layer disposed over (above) or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

One or more embodiments described herein employ germanium-on-silicon (Ge-on-Si) substrate device architectures which further employ a transition layer, disposed between a Ge-rich device layer and a Si substrate, that is doped to improve the resistance of the Ge-rich device layer to etchants employed to remove other semiconductor layers of a device stack composed of relatively less Ge than the device layer.

In embodiments a p-type doped semiconductor transition layer is disposed between a Ge-rich device layer and a Si substrate. Such arrangements may be utilized in the formation of germanium-based transistors as planar devices, fin or tri-gate based devices, and gate-all-around devices (e.g., nanowire devices). More specifically, one or more embodiments are directed to performing a release of rectangular-shaped Ge-containing nanowires or nanoribbons from Ge/SiGe, Ge/Si, SiGe/SiGe, or SiGe/Si multilayer stacks.

One or more embodiments described herein take advantage of a p-type δ-doped buried semiconductor layer to enhance resistance of an overlying Ge-rich device layer to certain wet etchants useful for removing other materials from the semiconductor device stack, such as one or more SiGe (or pure Si) layers having relatively lower Ge content (i.e., richer in Si than the device layer), thereby improving the etch process selectivity toward a device layer of either pure Ge, or of a SiGe richer in Ge. In embodiments, the presence of the p-type doped buried layer has been found to improve a Ge-rich device layer's resistance to wet etchants of SiGe employed during Ge device layer undercut and/or release processes (e.g., for gate-all-around or nanowire/nanoribbon devices), thereby conserving fine Ge-rich nanowire geometries.

The inventors have found that for certain wet etchants that are sensitive to the oxidation state of surface atoms in an exposed Ge layer (or SiGe layer relatively richer in Ge), dissolution of Ge may be dramatically decreased with the introduction of a buried p-type doped semiconductor layer into a semiconductor film stack. Although not bound by theory, the improved etch resistance of the Ge-rich device layer(s) is currently attributed, at least in part, to galvanic coupling between the Ge-rich device layer and the buried p-type doped layer with the charges and electronic states within the Ge-rich device layer being modulated by those in the p-type doped buried layer, thereby altering galvanic processes affecting the dissolution of Ge. Where the material layers between the Ge-rich device layer exposed to the etchant and the buried p-type doped layer are undoped (i.e., intrinsically doping concentration), the p-type doped layer can be set back below the device layers (e.g., 50-100 nm, or more), and still suppress etch of the overlying Ge-rich semiconductor device layer when exposed to a wet etchant of SiGe, for example.

In one or more embodiments, the p-type δ-doped buried layer is disposed above an n-type sub-channel leakage suppression layer of the semiconductor device stack, which may also be a δ-doped layer. Where the p-type doped layer is disposed over an n-type doped leakage suppression layer, the slabs of doped material may form a doping dipole. Rectifying characteristics associated with conduction band discontinuities resulting from the doping dipole may also play a role in observed Ge etch suppression. With the material layers between the Ge-rich device layer and the buried p-type doped layer being undoped (e.g. intrinsic), Ge etch suppression can also be achieved with a δ-doped p-type doped layer having a dopant concentration that ensures mobile charge is fully depleted by the underlying n-type doped leakage suppression layer so that the presence of the p-type doped layer does not deleteriously increase sub-channel leakage between a source and drain of a FET device. In embodiments, a p-type δ-doped buried layer may undergo migration/diffusion and spread to more than 15 nm during thermal processing (e.g., subsequent to an etching of SiGe selectively over Ge), but nevertheless does not fully compensate n-type dopant in the leakage suppression layer, enabling both Ge etch suppression during fabrication and suppression of leakage in the completed FET device.

FIG. 1A illustrates a cross-sectional view of a semiconductor layer stack 100 including a Ge device layer disposed over a delta-doped transition layer, in accordance with an embodiment of the present invention. As shown, the semiconductor device stack 100 includes a germanium (Ge)-based device layer stack 108 (such as a compressively stressed germanium layer) grown above a silicon (Si) substrate 104 (e.g., as a portion of a silicon wafer).

The substrate 104 may be composed of any semiconductor material that can withstand a manufacturing and serve as a seeding layer for crystalline growth of the semiconductor layers in the stack 100. In an embodiment, the substrate 104 is a bulk substrate, such as a P-type silicon substrate as is commonly used in the semiconductor industry. In an embodiment, substrate 104 is composed of a crystalline silicon, silicon/germanium or germanium layer doped with a charge carrier, such as but not limited to phosphorus, arsenic, boron or a combination thereof. In one embodiment, the concentration of silicon atoms in substrate 104 is greater than 97% or, alternatively, the concentration of dopant atoms is less than 1%. In another embodiment, substrate 104 is composed of an epitaxial layer grown atop a distinct crystalline substrate, e.g. a silicon epitaxial layer grown atop a boron-doped bulk silicon mono-crystalline substrate. Substrate 104 may also include an insulating layer disposed in between a bulk crystal substrate and an epitaxial layer to form, for example, a silicon-on-insulator substrate. In an embodiment, the insulating layer is composed of a material such as, but not limited to, silicon dioxide, silicon nitride, silicon oxy-nitride or a high-k dielectric layer. Substrate 104 may alternatively be composed of a group III-V material. In an embodiment, substrate 104 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In another embodiment, substrate 104 is composed of a III-V material and charge-carrier dopant impurity atoms such as, but not limited to, carbon, silicon, germanium, oxygen, sulfur, selenium or tellurium.

The Ge-rich device layer stack 108 may include one or more Ge device layers, with only a first Ge-rich device layer 108A illustrated in FIG. 1A. In an exemplary embodiment, the thickness of the Ge-rich device layer 108A is in the range of 5-15 nm and is composed of essentially pure Ge (i.e., some intrinsic level impurities may be present). Disposed between a Si substrate 104 and the Ge-rich device layer stack 108 is a silicon germanium (SiGe) buffer layer stack 106 (e.g., further including a first layer 106A of approximately 0.5-1 μm of $Si_{0.7}Ge_{0.3}$, and a second layer 106B composed of approximately 0.3-1 μm of $Si_{0.3}Ge_{0.7}$.) to accommodate thermal and/or lattice mismatch between Ge and Si. Alternatively, buffer layer stack 106 may comprise SiGe having a graded Ge composition (e.g., from 30% to 70%), or multiple layers of SiGe with varying Ge concentration, or any combinations of these various types buffer layer structures. In the exemplary embodiment, the buffer layer stack 106 is disposed immediately over, or directly on, the Si substrate 204 with a transition layer stack 107 that is further disposed immediately above, or on, the buffer layer stack 106, and also between the Si substrate 104 and the device layer stack 108.

The transition layer stack 107 includes an n-type doped SiGe layer 107A (e.g., a layer of relaxed phosphorous doped $Si_{0.3}Ge_{0.7}$). In the exemplary embodiment, the n-type doped SiGe layer 107A has a thickness of 5-20 nm with a dopant concentration in the range of 1e17-1e19 atoms/cm$^3$, and advantageously at least 1e18 cm$^{-3}$. Because phosphorous and other n-type dopants, such as arsenic, are fast diffusing in both SiGe and Ge, the n-type doped SiGe layer 107A is set back from the Ge device layer stack 108 to reduce entrance of N-type dopants into the Ge device layer stack 108. For example, the n-type doped SiGe layer 107A may be 25-100 nm below the Ge device layer 108, for example separated by a semiconductor layer 107C composed of relaxed intrinsic $Si_{0.3}Ge_{0.7}$). Alternatively, to further improve short channel effects, and/or leakage while the device layer 108 is in an "off" or non-conducting state, the semiconductor layer 107C may be (or further include in addition to a thickness of intrinsic $Si_{0.3}Ge_{0.7}$) an undoped Si or SiGe layer of relatively low concentration germanium (e.g., <7% Ge) as an enhanced diffusion barrier. Total thickness of the semiconductor layer 107A may therefore vary considerably.

The transition layer stack 107 further includes a p-type doped SiGe layer 107B (e.g., a layer of relaxed $Si_{0.3}Ge_{0.7}$). In the exemplary embodiment, the p-type dope SiGe layer 107B is a δ-doped layer approximating a 2-D slab of sheet charge. In such embodiments, the p-type doped SiGe layer 107B has a thickness of 5-15 nm, achievable through in-situ doping during epitaxial growth of the transition layer stack 107. Greater thicknesses may also be possible, constrained however so as to not completely compensate the n-type doped layer 107A. In the exemplary embodiment, the p-type doped SiGe layer 107B has a doping between 5e17 and 1e19 cm$^{-3}$, advantageously at least 1e18 cm$^{-3}$. The p-type dopant species is boron in the exemplary embodiment, though other p-type dopant species may be expected to perform similarly.

Figure 1B:
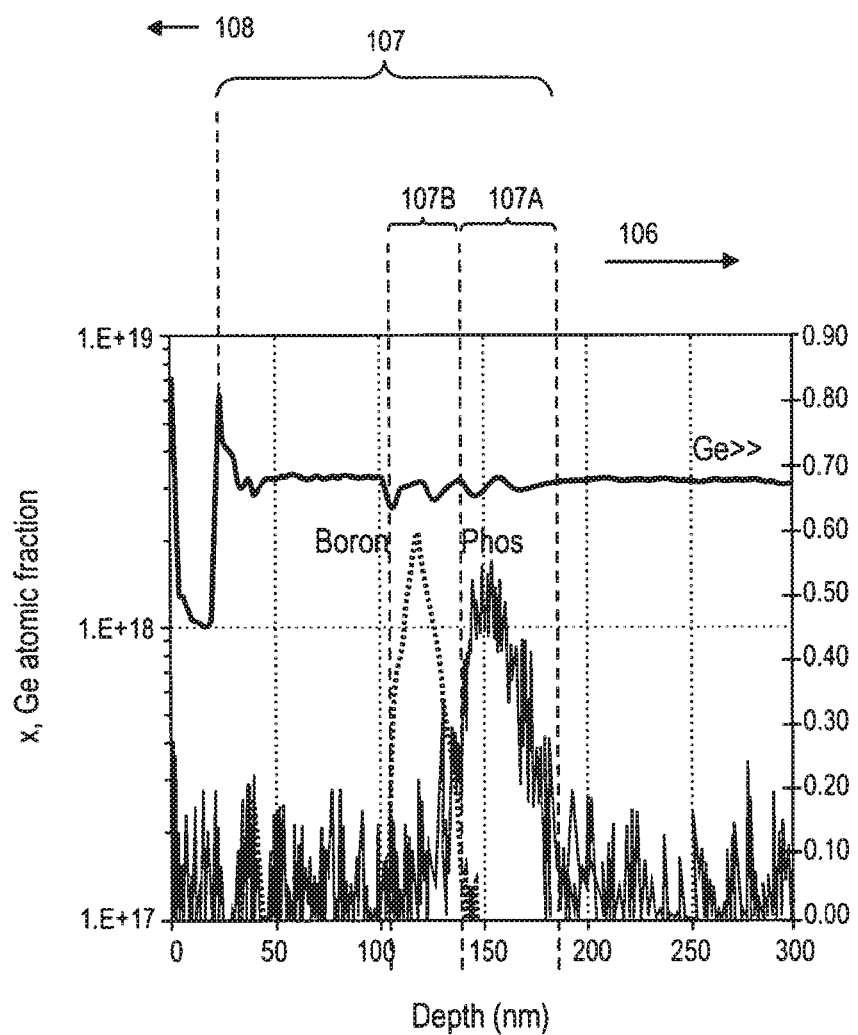
FIG. 1B illustrates a plot of dopant concentration depth profile of a semiconductor layer stack including a delta-doped p-type transition layer, in accordance with an embodiment of the present invention.

FIG. 1B illustrates a plot of dopant concentration depth profile of a semiconductor layer stack including a δ-doped p-type SiGe transition layer, such as layer 107B, disposed over an n-type doped leakage suppression layer, such a SiGe layer 107A, in accordance with an embodiment of the present invention. The dopant concentration depth profile illustrated represents an "as-grown" state of the semiconductor stack as opposed to an "as-annealed" state. As shown in FIG. 1B, a boron-doped SiGe transition layer has a boron concentration exceeding 2e18 cm$^3$ and approximating a δ-doping of at least 1e18 cm$^3$ over an approximate 15 nm span of depths demarked as "107B." A phosphorus doping reaching approximately 1e18 cm$^{-3}$ spans the depths demarked "107A" corresponds to the SiGe transition layer n-type doped leakage suppression layer. As shown in FIG. 1B, the phosphorus doped layer 107A has a greater thickness than the boron doped layer 107B and is more graduated than the boron doped layer 107B (i.e., not δ-doped).

In embodiments, a p-type SiGe transition layer is spaced apart from an underlying n-type SiGe transition layer by a non-intentionally doped (e.g., intrinsically doped) SiGe layer. Such a spacer layer is denoted 107A' in FIG. 1A and is of a minimal thickness (e.g., 2-5 nm) dependent on growth rate kinetics and the rapidity at which a growth chamber switches between an n-type and p-type dopant. The spacer layer 107A' is SiGe (e.g., $Si_{0.3}Ge_{0.7}$) which is grown after termination of n-type dopant and before p-type dopant is introduced. The effective doping of the spacer layer 107A' is illustrated for one embodiment in FIG. 1B, where both the boron and phosphorus doping levels are below 5e17 cm$^{-3}$. In embodiments, the spacer layer 107A' has a thickness of 2-5 nm. For embodiments at the upper end of this range, the layer 107A, 107A', and 107B may be characterized as a p-i-n δ-doped structure where at least the p-type layer is a δ-doped layer.

Figure 2A:
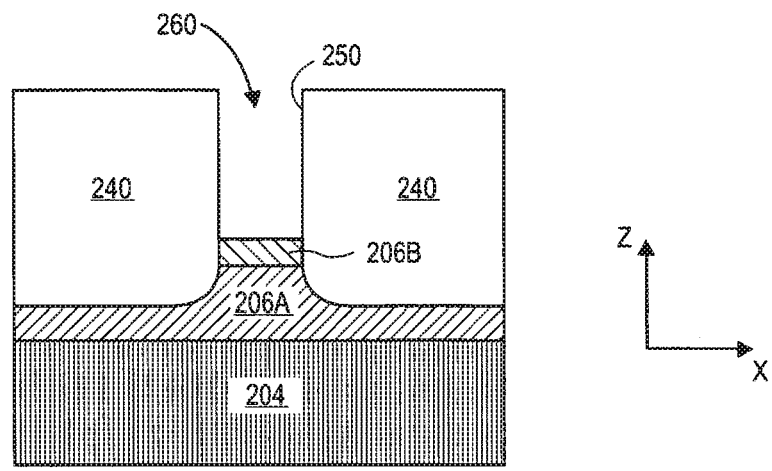
FIGS. 2A and 2B illustrate cross-sectional views of a local growth of the semiconductor layer stack depicted in FIG. 2A, in accordance with an embodiment of the present invention.
Figure 2B:
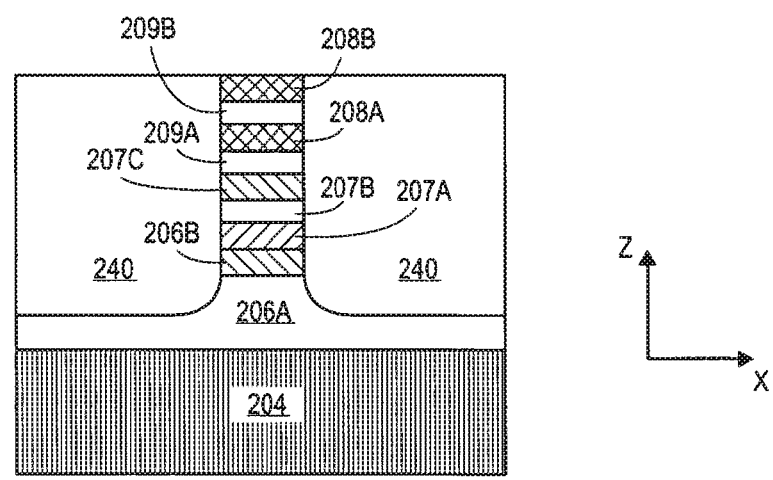

Depending on the embodiment, the semiconductor stack 100 may be either be a "global" film stack disposed over an entire area of a substrate (e.g., substrate 104 in FIG. 1A represents an entire wafer), or a "local" film stack that is disposed over only a certain portions of a substrate (e.g., substrate 104 in FIG. 1A represents small portion of a wafer). In either embodiment, the semiconductor stack 100 may be formed with any epitaxy technique known to be suitable for SiGe materials, such as but not limited to CVD and molecular beam epitaxy (MBE). As employed herein, an "epitaxial" layer is in registry with the seeding surface (e.g., having a preferred crystal orientation as a result of the crystallinity of the seeding surface). FIGS. 2A and 2B illustrate cross-sectional views of one local growth embodiment where the semiconductor layer stack depicted in FIG. 1A is grown with the benefit of aspect ratio trapping (ART).

As shown in FIG. 2A, an isolation dielectric has sidewalls 250 defining a trench 260 with a semiconductor seeding surface exposed at the trench bottom. As shown in FIG. 2B, local and selective epitaxial growth of crystalline semiconductor forms a SiGe buffer layer 206B (e.g., having properties as described for layer 106A) over a SiGe buffer layer 206A (e.g., having properties as described for layer 106A) disposed on a substrate 204 (e.g., having properties as described for substrate 104). Also disposed in the trench 260 are the transition layers 207A, 207B, and 207C (e.g., having properties as described for layers 107A, 207B, and 107C, respectively), and device layers 208A and 208B with intervening sacrificial layers 209A and 209B. In the exemplary embodiment, the sacrificial layers 209A and 209B are each SiGe layers and may each have a same composition. In advantageous embodiments, the Ge concentration in the sacrificial layers 209A, 209B is lower than in the transition layers (e.g., <70% Ge) to have a desired level of strain (e.g., 1-1.5%) relative to the transition layer 207C. In one embodiment, the device layers 208A and 208B are each essentially pure Ge. In another embodiment, the device layers 208A and 208B are each of a SiGe composition that is richer in Ge than the sacrificial layers 209A, 209B that are either a SiGe alloy, or may be silicon.

Figure 3A:
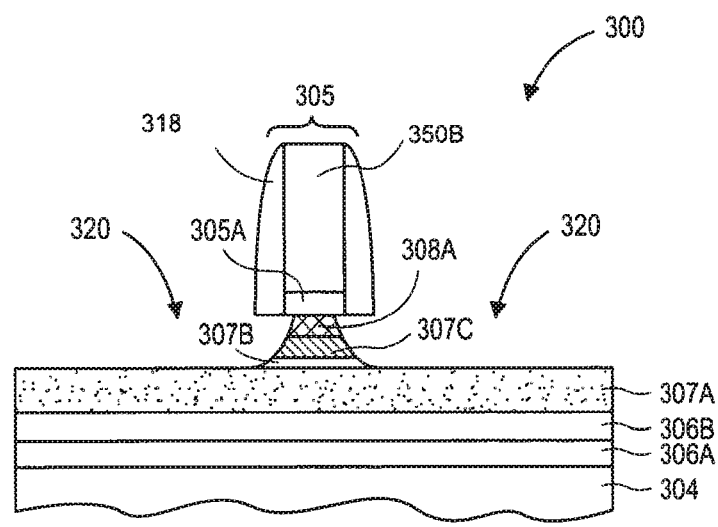
FIGS. 3A and 3B illustrate cross-sectional views in the fabrication of a planar semiconductor device employing the semiconductor stack of FIG. 1A, in accordance with another embodiment of the present invention.
Figure 3B:
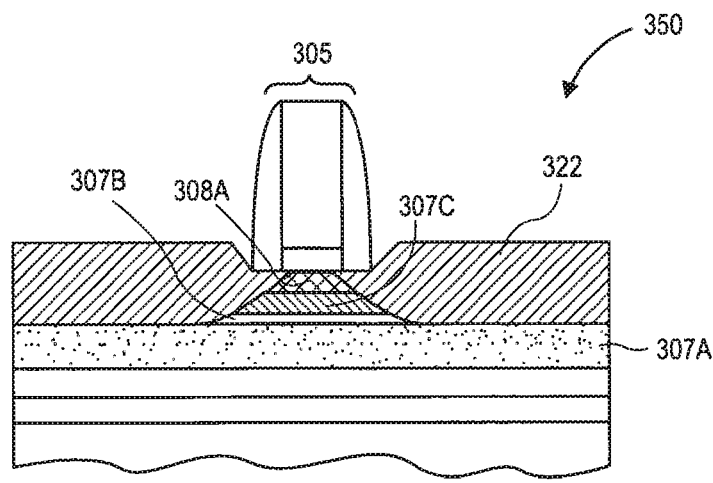

FIGS. 3A and 3B illustrate cross-sectional views of planar semiconductor device embodiments employing the semiconductor stack 100. Referring first to FIG. 3B, a semiconductor device 300 includes a gate stack 305 disposed above a substrate 304. A Ge-rich device layer 308A is disposed above the substrate 304, underneath the gate stack 305. Generally, the semiconductor device 300 may be any semiconductor device incorporating a gate, a channel region, and a pair of source/drain regions, such as, but not limited to, a MOS-FET. In the exemplary embodiment, the device 300 is a PMOS FET serving as one of complementary transistor types within a CMOS integrated circuit.

In the exemplary embodiment the Ge-rich device layer 308A is essentially pure Ge, compressively strained by 1-2%. A SiGe transition layer 307C is disposed above the substrate 304, below the germanium active layer 308A. An n-type junction leakage suppression layer 307A is disposed above the substrate 304, with the p-type Ge etch suppression layer 307B disposed between the transition layer 307C and the leakage suppression layer 307A, as was described in the context of the stack 100. In the exemplary PMOS embodiment, the raised source and drain regions 322 are deposited or grown heavily doped p-type (e.g., boron) and disposed above the junction leakage suppression layer 307A, on either side of the gate stack 305. The source drain regions 322 may form p+/n junctions with the n-type leakage suppression layer 307A, or not (e.g., source/drain regions 322 disposed on an upper portion of the transition layer 307C).

In the embodiment illustrated in FIG. 3A, the gate stack 305 is disposed directly on the Ge active layer 308A, the germanium device layer 308A is disposed directly on the undoped SiGe transition layer 307C, the transition layer 307C is disposed directly on the p-type transition layer 307B, the p-type transition layer 307B is disposed directly on the junction leakage suppression layer 307A (with only a SiGe spacer such as 107A' there between).

The gate stack 305 may include a gate electrode 305B disposed directly on a gate dielectric layer 305A, as shown in FIG. 3A. In an embodiment, the gate electrode 305B is composed of a metal gate and the gate dielectric layer 305A is composed of a high-K material. For example, in one embodiment, the gate dielectric layer 305A is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 305A may include a layer of native oxide formed from the top few layers of the Ge-rich device layer 308A. In an embodiment, the gate dielectric layer 305A is comprised of a top high-k portion and a lower portion composed of an oxide of a semiconductor material. In one embodiment, the gate dielectric layer 305A is composed of a top portion of hafnium oxide and a bottom portion of silicon dioxide or silicon oxy-nitride.

In an embodiment, the gate electrode 305B is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode 305B is composed of a non-workfunction-setting fill material formed above a metal workfunction-setting layer. In an embodiment, the gate electrode 305B is composed of a P-type material. The gate stack 305 may also include dielectric spacers 318, as depicted in FIG. 3A.

As shown in FIG. 3B, the source and drain regions 322 are "embedded," or "raised" replacement source and drain regions. FIG. 3A further illustrates a cross-sectional view during fabrication of the device 300. Referring to FIG. 3A, portions of the Ge-rich device layer 308A and, in the exemplary embodiment, portions of the top transition layer 307C, and even portions of the p-type transition layer 307B are removed to provide recessed regions 320, on either side of the gate stack 305. Recessed regions 320 may be formed by any suitable technique that removes portions of the device layer 308A etc., such as a dry etch or a wet etch process. In one embodiment, at least a portion of the recessed regions 320 are formed with a wet etch sensitive to the oxidation state of the Ge-rich device layer 308A, such as but not limited to aqueous hydroxide chemistries like ammonium hydroxide ($NH_4OH$), potassium hydroxide (KOH), tetramethylammonium hydroxide (TMAH), or other tetraalkylammonium hydroxides. In one embodiment, a first recessing of the regions 320 entails a dry plasma etch to define the Ge-rich device layer 308A using $NF_3$, HBr, $SF_6$, or $Cl_2$, while a second recessing of the regions 320 entails a wet etch of the SiGe transition layer 307C using an aqueous hydroxide chemistry. The presence of the p-type transition layer 307B is advantageous in formation of recessed regions 320, for example allowing a first etch of the Ge-rich device layer 308A, followed by a SiGe etch of the top transition layer 307C that is highly selective (near infinite) to the Ge-rich device layer 308A (being, for example pure Ge). As such, tips of the source, drain regions proximate to the ends of the device channel may be formed with great precision allowing for scaling of the gate length of the FET ($L_g$). In one embodiment, gate stack 305 guides the formation of recessed regions 320 (i.e., self-aligned recessed regions 320). In one embodiment, recessed regions 320 are formed with rounded corners, as shown in FIG. 3B. In another embodiment, however, recessed regions 320 are formed with faceted corners. In an embodiment, the n-type leakage suppression layer 307A serves as an etch stop during formation of the recessed regions 320. Referring again to FIG. 3B, a pair of embedded source, drain regions 322 is formed in the recessed regions 320, epitaxially, or not. In an embodiment, the source, drain regions 322 is uniaxially compressively stressing the Ge-rich device layer 308 and is composed of a material having a lattice constant larger than germanium, such as III-V materials having a lattice constant larger than germanium.

Figure 4C:
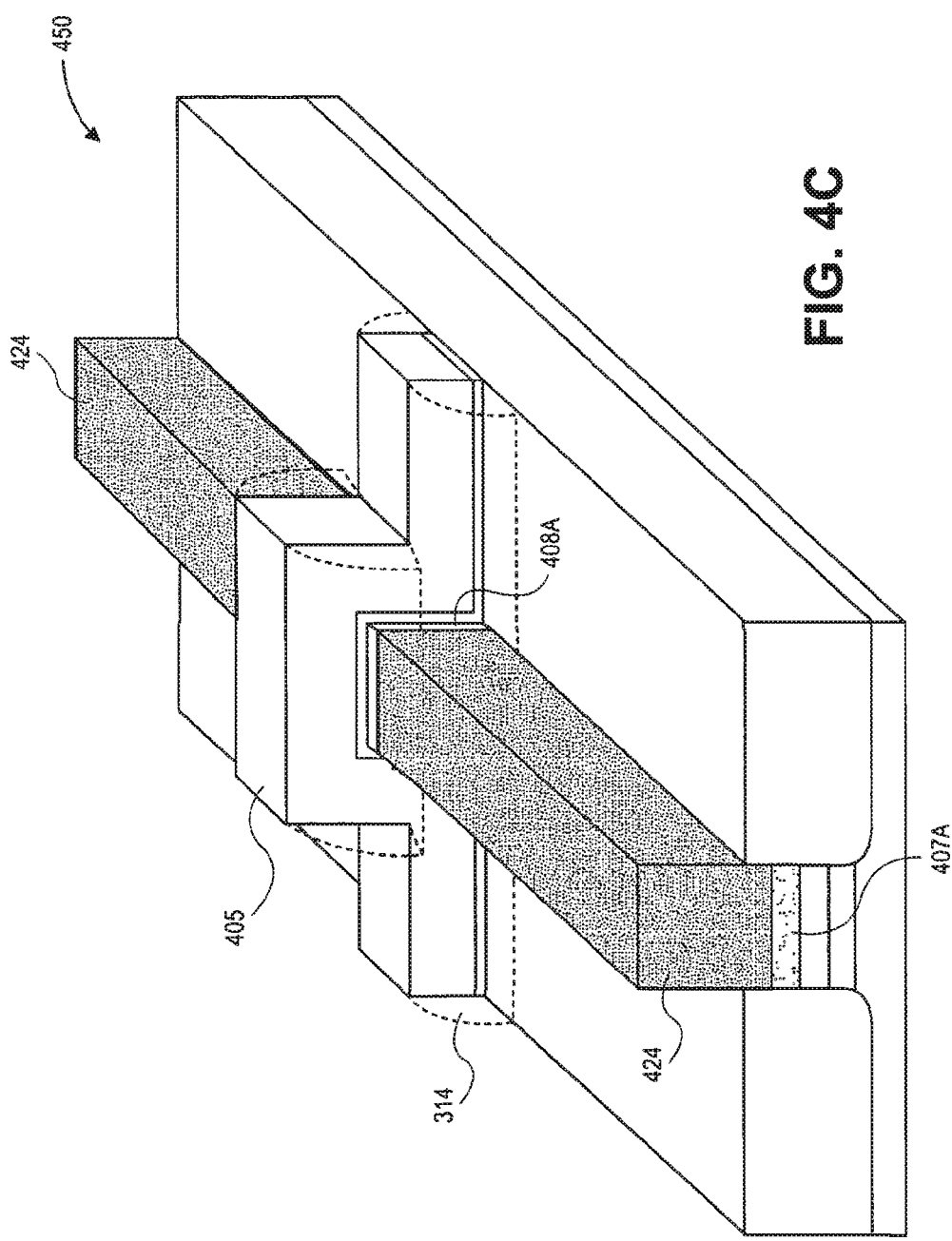

As mentioned above, embodiments of the present invention may be applied to non-planar MOS-FETs. For example, devices with a three-dimensional architecture, such as trigate devices, may benefit from the semiconductor device stack including a buried p-type transition layer. FIGS. 4A-4C illustrate angled views representing various operations in a method of fabricating non-planar semiconductor devices employing the semiconductor stack of FIG. 1A, in accordance with embodiments of the present invention.

Generally, non-planar FET embodiments can benefit from a buried p-type Ge etch suppression layer by enabling a fin to be formed in the Ge-rich device layer that is of very fine lateral dimension (e.g., <22 nm). Subsequent to forming the Ge-rich fin surrounding and/or underlying regions of SiGe may be etched with essentially infinite selectivity over the Ge-rich fin structure such that channel lengths, and/or source/drain tips, and/or sub-channel feature dimensions may be well-controlled with chemically sharp interfaces formed along the Ge-rich structures.

Referring to FIG. 4A, a semiconductor device 400 includes a gate stack 405 disposed above a substrate 404. A three-dimensional Ge-rich device body 408A is disposed above the substrate 404 and underneath the gate stack 405. An isolation region 420 is disposed above the substrate 404 with the three-dimensional device body 408A extending there from (device bodies planar with isolation region 420 are also possible). A top transition layer 407C is disposed above the substrate 404, below the three-dimensional germanium-rich device body 408A. A Ge etch suppression layer 407B is disposed below the top transition layer 407C and has at least some of the properties described elsewhere herein in the context of the layer 107B of the device stack 100 (FIG. 1). The layer 407B is disposed above a junction leakage suppression layer 407C that is disposed above the buffer 406 and the substrate 404. Material compositions and dimensions of all the semiconductor layers in the device 400 are the same, or similar to, those described for semiconductor device 300 as both device embodiments employ the semiconductor stack 100.

In one embodiment, at least a portion of the isolation region 420 and/or the non-planar semiconductor device stack surrounded by the isolation region 420 is formed with a wet etch sensitive to the oxidation state of the Ge-rich device layer 408A, such as, but not limited to, the aqueous hydroxide chemistries described elsewhere herein (TMAH, etc.). In one embodiment, a first etching of a semiconductor device stack (e.g., stack 100) to form the isolation region 420 entails a dry plasma etch, such as, but not limited to $NF_3$, HBr, $SF_6$, or $Cl_2$. A second etching, for example of the dry-etch sidewall of the semiconductor stack exposed by the dry etching, entails a wet etch of the SiGe transition layer 307C using aqueous hydroxide chemistries. Alternatively, or additionally, a recessing of the isolation region 420 relative to the non-planar semiconductor body may include a wet etch sensitive to the oxidation state of the Ge-rich device layer 408A, such as, but not limited to, the aqueous hydroxide chemistries described elsewhere herein (TMAH, etc.). In either situation, the presence of the p-type transition layer 307B enables a SiGe etch of the top transition layer 307C that is highly selective (near infinite) to the Ge-rich device layer 308A (being, for example pure Ge).

Portions of the device body 408A not disposed under the gate stack 405 (and surrounding dielectric spacers 418) are doped source and drain regions. In accordance with an embodiment of the present invention, the isolation region 420 is recessed to the interface of the three-dimensional Ge-rich (e.g., pure Ge) device body 408A and the top transition layer 407C (e.g., $Si_{0.3}Ge_{0.7}$), as depicted in FIG. 4A. However, other embodiments may include setting the height of the isolation regions 420 above or below this particular interface.

In an embodiment, the source and drain regions are formed by doping (e.g., p-type) portions of the three-dimensional germanium active body 406 uncovered by the gate stack 405. Portions of the transition layer 407C may also be p-type doped in the source and drain regions with p-type dopants extending all through way into the p-type layer 407B to form p+/n diodes with the n-type leakage suppression layer 407A at opposite ends of the non-planar device body. However, in another embodiment, the source and drain regions are embedded source and drain regions. For example, FIGS. 4B and 4C illustrate cross-sectional views in the fabrication of another semiconductor device having a Ge-rich device layer with an underlying diffusion barrier layer, in accordance with another embodiment of the present invention.

Referring to FIG. 4B, portions of the three-dimensional Ge-rich body 408A and, possibly, portions of the transition layer 407C and p-type transition layer 407B are removed to provide recessed regions 422, on either side of the gate stack 405. Recessed regions 422 may be formed by any suitable technique that removes portions of the three-dimensional Ge-rich device body 408A etc., such as a dry etch or a wet etch process. In one embodiment, at least a portion of the recessed regions 422 are formed with a wet etch sensitive to the oxidation state of the Ge-rich device layer 408A, the aqueous hydroxide chemistries described elsewhere herein (TMAH, etc.). In one embodiment, a first recessing of the regions 422 entails a dry plasma etch to define the Ge-rich device layer 408A using $NF_3$, HBr, $SF_6$ or $Cl_2$, while a second recessing of the regions 422 entails the wet etch using $NH_4OH$ or TMAH, or similar. The presence of the p-type transition layer 407B is advantageous in formation of recessed regions 422, for example allowing a first etch of the Ge-rich device layer 408A, followed by a SiGe etch of the transition layer 407C that is highly selective (near infinite) to the Ge-rich device layer 408A (being, for example, pure Ge). As such, tips of the source, drain regions may be formed with great precision allowing for scaling of the gate length of the FET ($L_g$). In one embodiment, gate stack 405 guides the formation of recessed regions 422, forming self-aligned recessed regions 422. In an embodiment, the n-type leakage suppression layer 407A serves as an etch stop during formation of the recessed regions 422.

Referring to FIG. 4C, a pair of raised source, drain regions 424 is formed in the recessed regions 422, epitaxially, or not. In an embodiment, the source, drain regions 424 are uniaxially compressively stressing the Ge-rich device layer 408A and are composed of a material having a lattice constant larger than germanium, such as III-V materials having a lattice constant larger than germanium.

FIG. 5A illustrates an isometric sectional view of a nanowire or nanoribbon semiconductor device employing the semiconductor stack of FIG. 1A, in accordance with an embodiment of the present invention. FIG. 5B illustrates a cross-sectional channel view of the nanowire-based semiconductor structure of FIG. 5A, in accordance with an embodiment of the present invention. FIG. 5C illustrates a cross-sectional view of the nanowire-based semiconductor structure of FIG. 5A, in accordance with an embodiment of the present invention.

Referring first to FIG. 5A, a semiconductor device 500 includes one or more vertically aligned or stacked germanium nanowires (508 set) disposed above a substrate 504. Embodiments herein include either single wire devices or multiple wire devices. As an example, a two nanowire-based device having nanowires 508A, 508B is shown for illustrative purposes. For convenience of description, nanowire 508A is used as an example where description is focused on only one of the nanowires in the set 508. It is to be understood that where attributes of one nanowire are described, embodiments based on a plurality of nanowires may have the same attributes for each of the nanowires.

Each of the Ge-rich (e.g.,. pure Ge) nanowires 508 includes a channel region 506 disposed in the nanowire. The channel region 506 has a length (L). Referring to FIG. 5B, the channel region also has a perimeter orthogonal to the length (L). Referring to both FIGS. 5A and 5B, a gate stack 505 surrounds the entire perimeter of each of the channel regions 506. The gate stack 505 includes a gate electrode along with a gate dielectric layer disposed between the channel region 506 and the gate electrode (not individually shown). The channel region 506 is discrete in that it is completely surrounded by the gate stack 505 without any intervening material such as underlying substrate material (such as the transition layer 107C in reference to the stack 100) or other sacrificial channel fabrication materials spacing apart the Ge-rich nanowires 508. Accordingly, in embodiments having a plurality of nanowires 508, the channel regions 506 of the nanowires are also discrete relative to one another, as depicted in FIG. 5B. A junction leakage suppression layer 507A is disposed above the substrate 504, below the one or more germanium nanowires 508. The gate stack 505 is disposed over the n-type leakage suppression layer 507A, and may be on the SiGe transition layer 507C, as illustrated. Although not depicted, in an embodiment, a buffer may be disposed directly between the substrate 504 and the junction leakage suppression layer 507A, substantially as described in the context of device stack 100.

Referring again to FIG. 5A, each of the nanowires 508 also includes source and drain regions 510 and 512 disposed in the nanowire on either side of the channel region 506. The source and drain regions 510/512 are disposed on the SiGe transition layer 507C, as illustrated. In an embodiment, the source and drain regions 510/512 are replaced source and drain regions, e.g., at least a portion of the nanowires is removed and replaced with a source/drain material region. However, in another embodiment, the source and drain regions 510/512 are composed of portions of the one or more germanium nanowires 508 that are merely doped (e.g., by boron implant, etc.).

A pair of contacts 514 (dash lined in FIG. 5A) is disposed over the source/drain regions 510/512. In an embodiment, the semiconductor device 500 further includes a pair of spacers 516 (dash lined in FIG. 5A). The spacers 516 are disposed between the gate stack 505 and the pair of contacts 514. As described above, the channel regions and the source/drain regions are, in at least several embodiments, made to be discrete. However, not all regions of the nanowires 508 need be discrete. For example, referring to FIG. 5C, nanowires 508A-508B are not discrete at the location under spacers 516. In one embodiment, the stack of nanowires 508A-508B have intervening sacrificial semiconductor material there between (509B), and below (509A), which may be SiGe (e.g., of a lower Ge concentration than that of transition layer 107C), or silicon. In one embodiment, the bottom nanowire 508A is still in contact with a portion of the transition layer 507C, e.g., used in fabrication as described below.

In an embodiment, the one or more Ge-rich nanowires 508 are composed essentially of germanium, the transition layer 507C is $Si_{0.3}Ge_{0.7}$, the p-type Ge etch suppression layer 507B is p-type doped $Si_{0.3}Ge_{0.7}$ and the junction leakage suppression layer 507A is n-type doped $Si_{0.3}Ge_{0.7}$, as described elsewhere herein for the device stack 100. In an embodiment, the one or more germanium nanowires 508 are compressively stressed (e.g., by 1-2% relative to the transition layer 507C).

Although the device 500 described above is for a single device, e.g., a PMOS device, a CMOS architecture may also be formed to include both NMOS and PMOS nanowire-based devices disposed on or above the same substrate. In an embodiment, the nanowires 508 may be sized as wires with z and y dimensions substantially the same, or as ribbons with one of the z and y dimensions greater than the other. The nanowires 508 may have squared-off, rounded, or faceted (e.g. at some angle non-orthogonal to z and y axis). Material compositions and dimensions may be the same or similar as those described for semiconductor stack 100, and device 300 or 400.

In another aspect, methods of fabricating a nanowire semiconductor structure are provided. For example, FIGS. 6A-6D illustrate three-dimensional cross-sectional views representing various operations in a method of fabricating a nanowire semiconductor device having, at least at one point in the process, a Ge-rich device layer with an underlying SiGe transition layer, and a p-type doped Ge etch suppression layer, in accordance with an embodiment of the present invention.

Figure 6A:
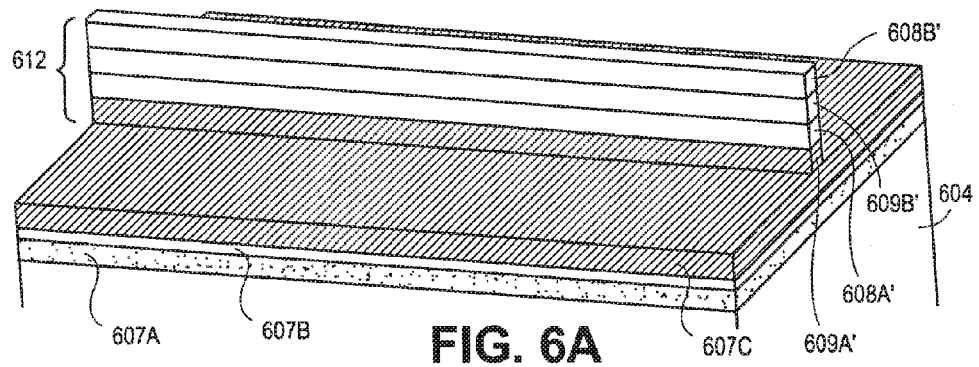
FIGS. 6A-6D illustrate isometric sectional views representing various operations in a method of fabricating a nanowire semiconductor device having, at least at one point in the process, a germanium device layer disposed over a p-doped transition layer, in accordance with an embodiment of the present invention.

Referring to FIG. 6A, a fin-type structure 612 is formed above a substrate 604. The fin includes Ge-rich device layers 608A' and 608B' and two intervening silicon-rich material layers 609A' and 609B', such as a silicon or silicon germanium layers of high Si content than the device layer 608A' and 608B'. The fin stops on the transition layer 607C, although in other embodiments the fin-type structure 612 may extend down to include a patterned portion of a transition layer 607C. Although not depicted, in an embodiment, a buffer is disposed directly between the substrate 604 and the junction leakage suppression layer 607C.

Figure 6B:
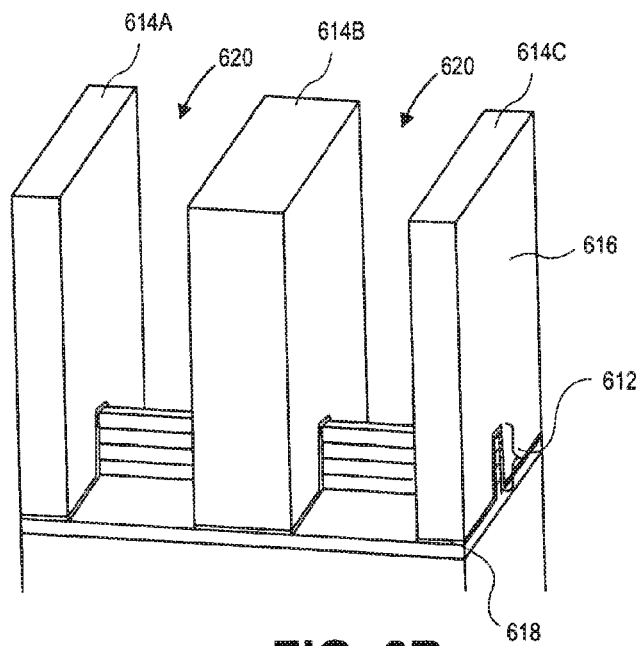

FIG. 6B illustrates the fin-type structure 612 with three sacrificial gate structures 614A, 614B, and 614C disposed thereon. In one such embodiment, the three sacrificial gates 614A, 614B, and 614C are composed of a sacrificial gate oxide layer 616 and a sacrificial polysilicon gate layer 618 which are, e.g., blanket deposited and patterned with a plasma etch process conventional to the art.

Figure 6C:
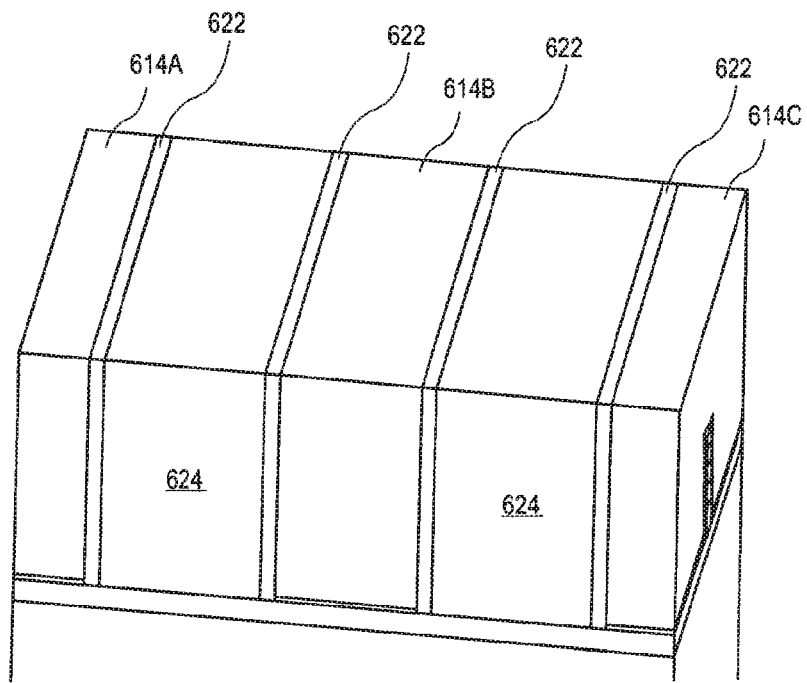

Following patterning to form the three sacrificial gates 614A, 614B, and 614C, spacers may be formed on the sidewalls of the three sacrificial gates 614A, 614B, and 614C, and doping may be performed in regions 620 of the fin-type structure 612 shown in FIG. 6B (e.g., tip and/or source and drain type doping), and an interlayer dielectric layer may be formed to cover and then re-expose the three sacrificial gates 614A, 614B, and 614C. The interlayer dielectric layer may then be polished to expose the three sacrificial gates 614A, 614B, and 614C for a replacement gate, or a gate-last, process. Referring to FIG. 6C, the three sacrificial gates 614A, 614B, and 614C are exposed, along with spacers 622 and interlayer dielectric layer 624.

Figure 6D:
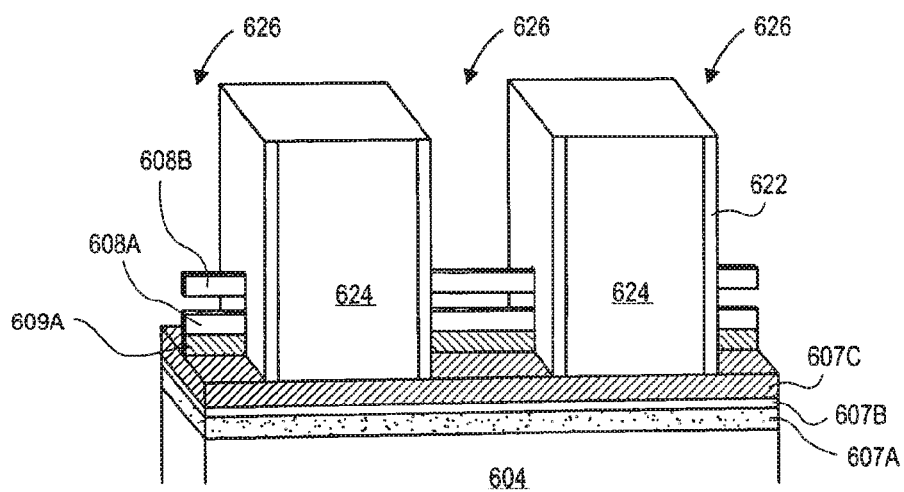
Figure 7:
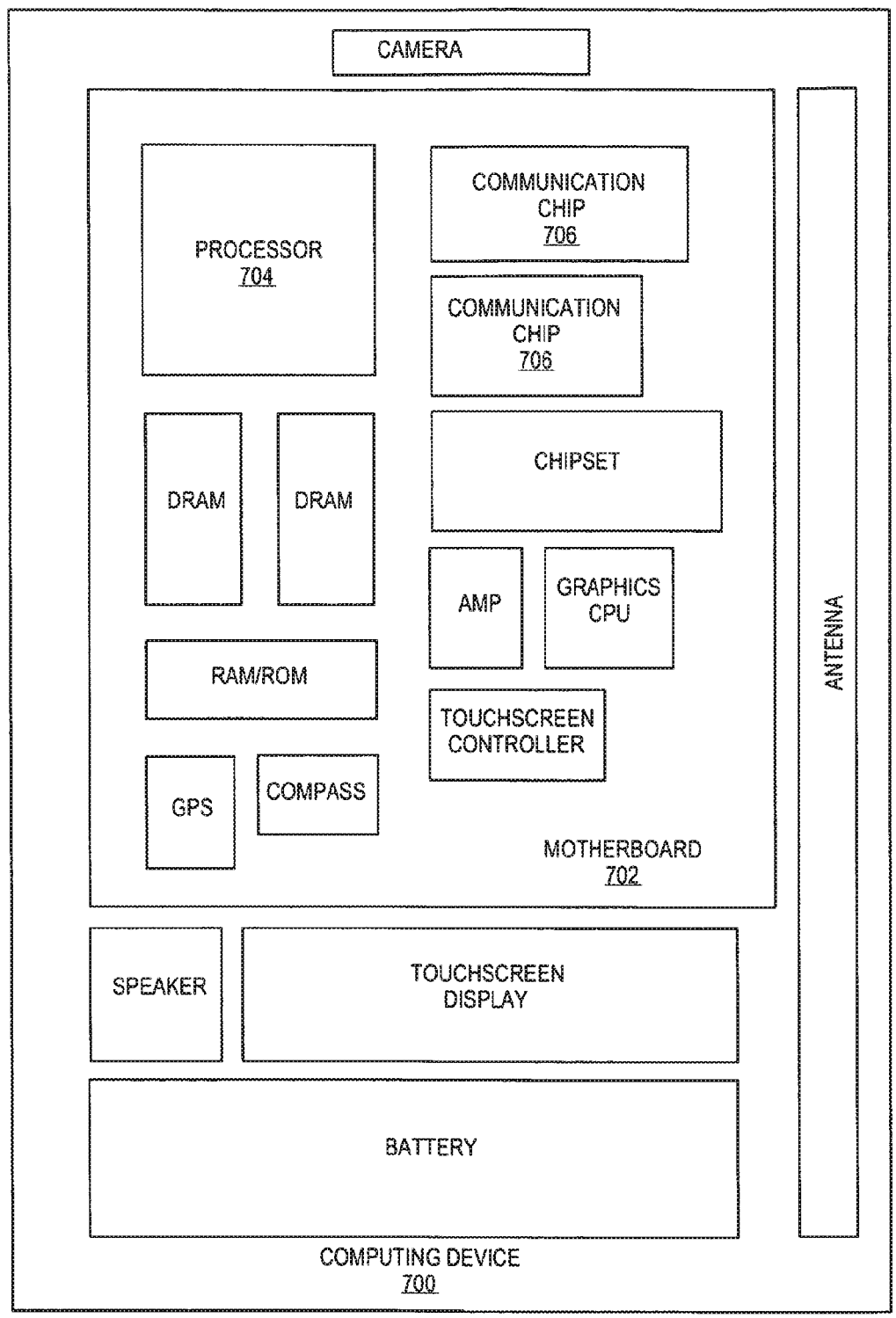
FIG. 7 illustrates a computing device in accordance with one implementation of the invention.

The sacrificial gates 614A, 614B, and 614C are then removed, e.g., in a replacement gate or gate-last process flow convention in the art for the materials chosen, to expose channel portions of the fin-type structure 612. Referring to FIG. 6D, the sacrificial gates 614A, 614B, and 614C are removed to provide trenches 626 and, thus, reveal channel portions of the nanowires. Portions of the intervening sacrificial layers exposed by the trenches 626 are removed to leave discrete portions of the Ge-rich device layers 608A' and 608B' to form nanowires 608A and 608B. In FIG. 6D, sacrificial material 609A is illustrated for clarity, but would typically be removed concurrently with a sacrificial layer disposed between 608A and 608B.

In an embodiment, the silicon-rich sacrificial layers 609A and 609B are etched selectively with a wet etch that does not etch the Ge-rich device layers 608A' and 608B' to release, or undercut, lengths of the device layers 608A' and 608B' not anchored by other structures (e.g., spacers 622). In one embodiment, the wet etch is sensitive to the oxidation state of the Ge-rich device layers 608A' and 608B'. Etch chemistries such as, but not limited to aqueous hydroxide chemistries, including $NH_4OH$, KOH, and TMAH, for example, may be utilized to selectively etch the sacrificial layers 609A and 609B. The presence of the p-type transition layer 607B is advantageous in improving the selectivity of a SiGe etch relative to the Ge-rich device layers 608A' and 608B'. In embodiments where the device layers 608A' and 608B' are example pure Ge, etch selectivity is nearly infinite to the nanowires, such that the sacrificial layers 609A and 609B may be removed along a chemically sharp interface with the device layers 608A' and 608B' (i.e., no portion of the device layers are etched).

In alternative embodiments, although not shown, the transition layers 607C and 607B may also be removed, e.g., prior to, following, or at the same time as removal of sacrificial layers 609A and 609B. Also, the diffusion barrier layer may be totally removed or only partially removed, e.g., leaving remnants under the spacers, or alternatively may be left intact. Subsequently device fabrication may be completed. In one embodiment, a surrounding gate electrode is formed around the germanium nanowires 604 and 608 and over the leakage suppression layer 507A, as described above in association with FIG. 5A.

At the process stage depicted in FIG. 6D, channel engineering or tuning may be performed. For example, in one embodiment, the discrete portions of the Ge-rich device layer 608A and 608B may be thinned using oxidation and etch processes, etc. Accordingly, the initial wires formed from Ge-rich layers 608A' and 608B' may begin thicker and are thinned to a size suitable for a channel region in a nanowire device, independent from the sizing of the source and drain regions of the device.

Following formation of the discrete channel regions as depicted in FIG. 6D, high-k gate dielectric and metal gate processing may be performed and source and drain contacts may be added. Contacts may be formed in the place of the interlayer dielectric layer 624 portions remaining in FIG. 6D. Furthermore one or more thermal processes may anneal the semiconductor layers such that the p-type doped layer 607B and n-type doped layer 607A may diffuse together, even to the point that the p-type and n-type dopants do not form separate peaks in a dopant profile as shown in FIG. 1B. The n-type doped layer 607A however is not completely compensated by the p-type doped layer 607A and as the anneals may be performed well after selective etching of the SiGe sacrificial layers, the function of the p-type doped layer 607A may still be realized.

FIG. 8 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some embodiments of the invention, the integrated circuit die of the processor includes one or more devices, such as MOS-FETs built in accordance with embodiments described elsewhere herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another embodiment of the invention, the integrated circuit die of the communication chip includes one or more devices, such as MOS-FETs with features and/or fabricated in accordance with embodiments described elsewhere herein.

In further implementations, another component housed within the computing device 700 may contain an integrated circuit die that includes one or more devices, such as MOS-FETs with features and/or fabricated in accordance with embodiments described elsewhere herein.

In embodiments, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

It is to be understood that the above description is intended to be illustrative, and not restrictive. Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A semiconductor structure, comprising:
    a germanium (Ge)-rich nanowire above a substrate, the Ge-rich nanowire having a channel region;
    a SiGe transition layer above the substrate, and below the Ge-rich nanowire;
    a SiGe layer above the substrate, and below the SiGe transition layer;
    a gate electrode surrounding the channel region of the Ge-rich nanowire, wherein a portion of the gate electrode is between the Ge-rich nanowire and the SiGe transition layer;
    a source region adjacent to a first end of the channel region of the Ge-rich nanowire at a first side of the gate electrode; and a drain region adjacent to a second end of the channel region of the Ge-rich nanowire opposite the first end of the channel region, the drain region at a second side of the gate electrode opposite the first side.

2. The semiconductor structure of claim 1, further comprising:
   a δ-doped SiGe layer above the substrate, between the SiGe transition layer and the SiGe layer.

3. The semiconductor structure of claim 2, wherein the δ-doped SiGe layer is separated from the SiGe layer by a SiGe spacer layer.

4. The semiconductor structure of claim 3, wherein the SiGe transition layer, the δ-doped SiGe layer, the SiGe spacer layer, and the SiGe layer all have a same silicon and germanium content.

5. The semiconductor structure of claim 4, wherein the SiGe transition layer is between 25 and 100 nm thick, the δ-doped SiGe layer is between 5 and 15 nm thick, the SiGe spacer layer is between 2 and 5 nm thick, and the SiGe layer is between 5 and 20 nm thick.

6. The semiconductor structure of claim 2, wherein the SiGe transition layer is intrinsic, wherein the δ-doped SiGe layer has a dopant concentration of at least $1e18 cm^{-3}$, and wherein the SiGe layer has a dopant concentration of at least $1e18 cm^{-3}$.

7. The semiconductor structure of claim 1, wherein the Ge-rich nanowire consists essentially of germanium and is undoped.

8. The semiconductor device of claim 1, further comprising:
   a gate dielectric layer between the gate electrode and the channel region of the Ge-rich nanowire.

9. The semiconductor structure of claim 8, wherein the gate electrode comprises a metal, and wherein the gate dielectric layer comprises a high-K material.

10. The semiconductor device of claim 1, further comprising:
    a first dielectric spacer at the first side of the gate electrode;
    a second dielectric spacer at the second side of the gate electrode; and
    a semiconductor material between the Ge-rich nanowire and the SiGe transition layer under the first and second dielectric spacers.

* * * * *